United States Patent [19]

Maksim

[11] Patent Number: 5,487,416
[45] Date of Patent: * Jan. 30, 1996

[54] LEAD CONDITIONING SYSTEM FOR SEMICONDUCTOR DEVICES

[75] Inventor: James E. Maksim, Santa Clara, Calif.

[73] Assignee: Precision Technologies, Inc., Santa Clara, Calif.

[ * ] Notice: The portion of the term of this patent subsequent to Dec. 28, 2010, has been disclaimed.

[21] Appl. No.: 147,874

[22] Filed: Dec. 3, 1993

Related U.S. Application Data

[63] Continuation-in-part of Ser. No. 806,054, Dec. 11, 1991, Pat. No. 5,273,081.

[51] Int. Cl.⁶ .................................................. B21F 01/02
[52] U.S. Cl. ............................................................ 140/105
[58] Field of Search ....................................... 140/105, 147

[56] References Cited

U.S. PATENT DOCUMENTS

| | | | |
|---|---|---|---|
| 3,687,172 | 8/1972 | Suverkropp | 140/147 |
| 3,796,201 | 3/1974 | Golub | 140/105 |
| 3,880,205 | 4/1975 | Linker et al. | 140/147 |
| 4,103,718 | 8/1978 | Steigerwald | 140/105 |
| 4,481,984 | 11/1984 | Linker | 140/147 |
| 4,727,912 | 3/1988 | Gonzales | 140/147 |
| 4,765,376 | 8/1988 | Leiwe | 140/147 |
| 5,113,916 | 5/1992 | Linker, Jr. | 140/147 |
| 5,273,081 | 12/1993 | Maksim | 140/147 |

FOREIGN PATENT DOCUMENTS

| | | | |
|---|---|---|---|
| 157717 | 6/1989 | Japan | 140/105 |

*Primary Examiner*—Lowell A. Larson
*Attorney, Agent, or Firm*—Flehr, Hohbach, Test, Albritton & Herbert

[57] ABSTRACT

An apparatus and method for conditioning the leads of a semiconductor device having parallel leads formed to a predetermined configuration. The apparatus includes a device for engaging and massaging the leads to reintroduce a predetermined spacing between the leads, bringing the leads into parallelism. The apparatus also includes a device for forming the leads to a partially unbent condition having at least one clamping arm pivotal between a first position spaced from the leads and a second position compressing a portion of the leads between the clamping arm and the support. The apparatus further includes a device for reforming the leads to a predetermined configuration. The lead conditioning method includes the steps of bringing the leads into parallelism, positioning the semiconductor device on a support, forming the leads to a partially unbent condition by pivoting at least one arm toward the leads and compressing a portion of the leads between the arm and the support, and shaping the leads to a partially unbent condition.

24 Claims, 13 Drawing Sheets

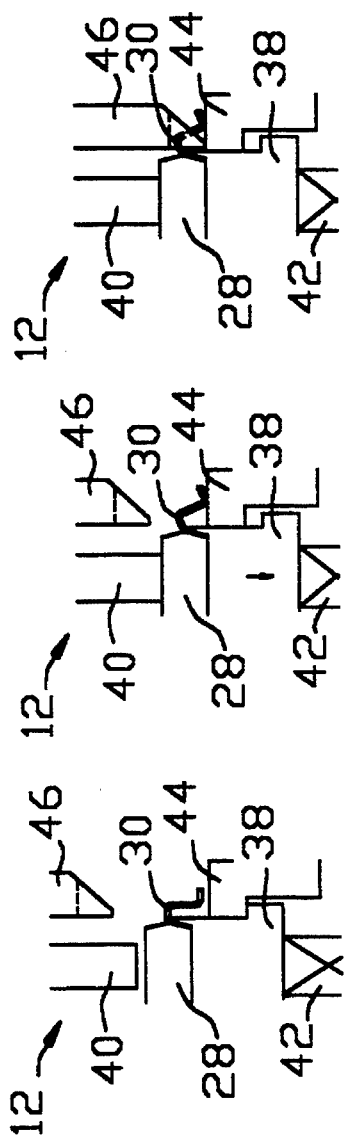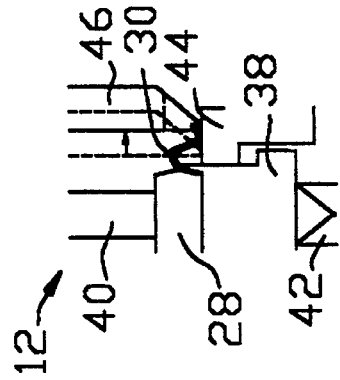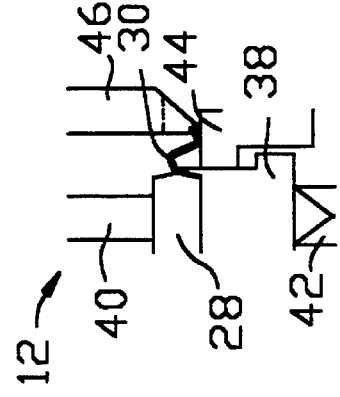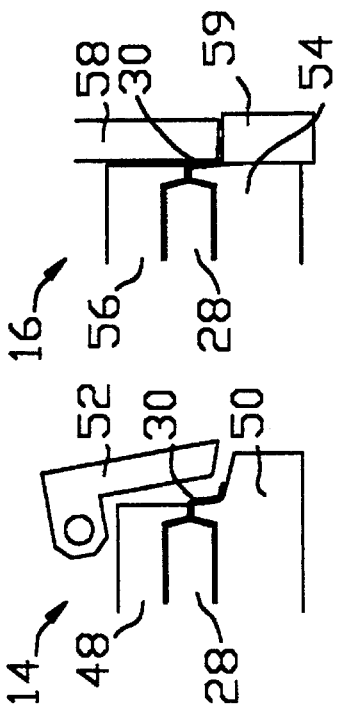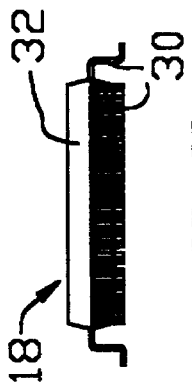

LEAD CONDITIONING SYSTEM FOR SEMICONDUCTOR DEVICES

CROSS-REFERENCE TO RELATED APPLICATIONS

This application is a continuation-in-part of U.S. application, Ser. No. 07/806,054, filed Dec. 11, 1991, now U.S. Pat. No. 5,273,081 granted Dec. 28, 1993.

BRIEF DESCRIPTION OF THE INVENTION

The present invention relates in general to an apparatus and method for conditioning the leads of a semiconductor device and, more particularly, to a system for reshaping the leads of a semiconductor device of the type having parallel leads formed to a predetermined configuration.

BACKGROUND OF THE INVENTION

In many applications, semiconductor devices are packaged within a molded body for protection against the corrosive elements of the environment. A plurality of lead conductors or leads project from the sides of the molded body to electrically connect the semiconductor device to an associated circuit such as a circuit board. The lead conductors are constructed from a pliable metal which can be easily formed into a desired configuration without damaging either the semiconductor chip or the molded body. However, the application of even a small amount of pressure easily bends the leads away from the desired configuration. Considerable care must be taken when handling the packaged semiconductor device to protect the lead conductors from deformation. Even then, the leads of a large number of semiconductor devices often become deformed. For example, some leads may have been bent together, while other leads may have been bent so that the lead tips are no longer coplanar. Additionally, the lead conductors on opposing ends of the molded body may be deformed to distort the tweeze or tip-to-tip distance of the device. A semiconductor device with deformed leads is typically useless because the lead tips do not rest on the appropriate solder points and the semiconductor device does not fit within the designated location on the circuit board.

One method of mounting a semiconductor device to a circuit board includes positioning the device by hand and then soldering it in place. More commonly, the semiconductor device is set on the circuit board by an automatic placement machine, with the lead tips positioned on a spot of solder paste. The board is then heated, melting the solder paste to secure the leads in place and electrically connect the semiconductor device to other components. The tips of deformed leads often do not contact the solder paste, resulting in a defective circuit board. Moreover, the unused solder spot may bridge the pads on the board when the solder is melted, shorting the electronic circuit. Since substantial expense is involved in the manufacture of semiconductor devices, a system which would reform the bent leads to the desired configuration is desirable.

Methods exist in the art for salvaging defective semiconductor devices by straightening the bent leads. The bent lead conductors can be reformed by manually bending each lead back to the appropriate configuration. Using this method does restore many of the deformed devices to an acceptable condition, however the process is extremely time consuming and subject to human error. Additionally, the reformed leads often retain an elastic memory of the deformation and tend to partially spring back to the bent condition. If not severely deformed, the bent lead conductors may be reformed by clamping the projecting leads between opposed dies. However, clamping the lead conductors between opposed dies will not reintroduce parallelism between the leads. U.S. Pat. No. 4,727,912 shows a lead straightening device in which teeth mounted to an upper die are inserted in between the leads of a semiconductor device positioned on a lower die as the upper die is lowered. The upper and lower dies are pressed together, compressing the leads to remove elastic memory of the deformation. Although the disclosed device reintroduces parallelism between the lead conductors, severely deformed leads may be damaged by the teeth when the dies are pressed together. Moreover, the leads will spring back toward the deformed configuration since the leads retain elastic memory of the deformation. A system for reconditioning bent leads which is capable of reforming the leads while substantially erasing lead memory of prior bending is desirable.

U.S. Pat. No. 4,481,984 discloses an alternative method for conditioning the deformed leads which employs opposed blades that straighten and massage the leads as the semiconductor device passes along a track. The disclosed assembly includes a pair of wiper blades which are moved toward the semiconductor device in an arcuate path so that contact between the blades and the body of the device is avoided. After the wiper blades have been moved near the device body, the blades are lowered in a generally vertical direction to sweep the leads into grooves of a separator blade. The second wiper blade pushes the leads into the grooves and retains the leads them in place while the second wiper blade and the separator blade and the second wiper blade are oscillated, massaging the compressed leads. The disclosed assembly removes elastic memory from the deformed leads which were pressed together. However, elastic memory in the leads deformed in other ways is not completely removed and severely bent leads may be damaged as the blades are pressed together. A system for reconditioning bent leads which reintroduces parallelism and a predetermined configuration while completely erasing elastic memory of the prior deformation is desirable.

The leads of a semiconductor device are typically plated with a lead finish consisting of, for example, lead and tin. When the leads of a device are reformed, the conditioning mechanism may scrape the leads, scratching and partially removing the plated finish. A semiconductor device with scratched leads may fail to meet required quality standards, as the scratched leads may not be efficiently soldered to a circuit board. Moreover, the scratched leads often exhibit corrosion problems. The slivers produced by scraping the lead finish may accumulate in the conditioning mechanism, requiring frequent cleaning and maintenance of the lead conditioning device. A lead conditioning apparatus for reforming the bent leads of a semiconductor device which minimizes contact with the leads, and therefore scraping of the lead finish, is desirable.

Semiconductor devices produced by different manufacturers often have different dimensions, particularly if the devices are produced in different countries. Many lead conditioning systems will not accommodate the dimensional variations of devices produced in different countries. Thus, when semiconductor devices from several manufacturers are employed, multiple lead conditioning systems may be required for conditioning and reforming bent leads. A lead conditioning system which may be conveniently adjusted so that variations among different semiconductor devices may be accommodated is desirable.

The disclosed assemblies may be employed to reform leads projecting from only one or two sides of a semiconductor device. A system which efficiently and conveniently reconditions leads projecting from all four sides of a semiconductor device simultaneously would be particularly valuable.

OBJECTS AND SUMMARY OF THE INVENTION

It is a primary object of the present invention to provide a system for conditioning the leads of a semiconductor device having deformed leads.

A further object of the present invention is to provide a system for conditioning the leads of a semiconductor device which substantially removes elastic memory of the deformation from the leads.

Another object of the present invention is to provide a system for conditioning the leads of a semiconductor device which minimizes contact between the leads and the conditioning mechanism to substantially reduce scraping of the plated lead finish.

Yet another object of the present invention is to provide a system for conditioning the leads of a semiconductor device which may be conveniently adjusted to accommodate semiconductor devices having different dimensions.

A more general object of the present invention is to provide a system for salvaging damaged semiconductor devices by reconditioning the leads to reintroduce a predetermined configuration to the leads.

In summary, the present invention is particularly suitable for conditioning and reforming the bent leads of a semiconductor device of the type having parallel leads formed to a predetermined configuration. The lead conditioning apparatus of the present invention includes an engaging and massaging device for reintroducing a predetermined spacing between the deformed leads to bring the leads into parallelism. A forming device forms the leads to a partially unbent condition includes a support for retaining the semiconductor device and at least one clamping arm. The arm may be pivoted between a first position spaced from the leads and a second position compressing a portion of the leads between the clamping arm and the support. The clamping arm and support open at least one bend of the predetermined lead configuration to remove elastic memory of the bend and other deformations. The lead conditioning system also includes a reforming device which reintroduces the predetermined configuration to the leads. The reforming device has a support member formed to retain a semiconductor device, a reform anvil for reforming the leads and an adjustment device for adjusting the relative positioning of the support member and the reform anvil to accommodate different semiconductor devices. The three devices of the system of the present invention condition the bent leads into a properly configured semiconductor device.

The lead conditioning method of the present invention is particularly suitable for conditioning the leads of a semiconductor apparatus having deformed leads. The method includes the steps of bringing the bent leads into parallelism and positioning the semiconductor device on a support. At least one clamping arm is pivoted toward the support, compressing a portion of the leads between the clamping arm and the support, forming the leads to a partially unbent condition to remove elastic memory of the deformed configuration. The method also includes the step of shaping the leads to desired lead configuration. The lead conditioning system of the present invention salvages semiconductor devices having deformed leads by reforming the leads to a desired configuration.

Additional objects and features of the invention will be more readily apparent from the following detailed description and appended claims when taken in conjunction with the drawings.

BRIEF DESCRIPTION OF THE DRAWINGS

FIG. 2A shows a semiconductor device with bent leads.

FIG. 2B shows a schematic diagram of a semiconductor device loaded in an engaging and massaging station in accordance with the present invention, at the beginning of operation.

FIG. 2C shows a schematic diagram of a semiconductor device loaded in an engaging and massaging station in accordance with the present invention, during operation.

FIG. 2D shows a schematic diagram of a semiconductor device loaded in an engaging and massaging station in accordance with the present invention, at the stage of operation following that shown in FIG. 2C.

FIG. 2E shows a schematic diagram of a semiconductor device loaded in an engaging and massaging station in accordance with the present invention, at the stage of operation following that shown in FIG. 2D.

FIG. 2F shows a schematic diagram of a semiconductor device loaded in an engaging and massaging station in accordance with the present invention, at the stage of operation following that shown in FIG. 2E.

FIG. 2G shows a schematic diagram of a semiconductor device loaded in a forming station in accordance with the present invention.

FIG. 2H shows a schematic diagram of a semiconductor device loaded in a reforming station in accordance with the present invention.

FIG. 2I shows a reconditioned semiconductor device with straight parallel leads projecting in a predetermined configuration.

DETAILED DESCRIPTION OF THE INVENTION

Figure 1:
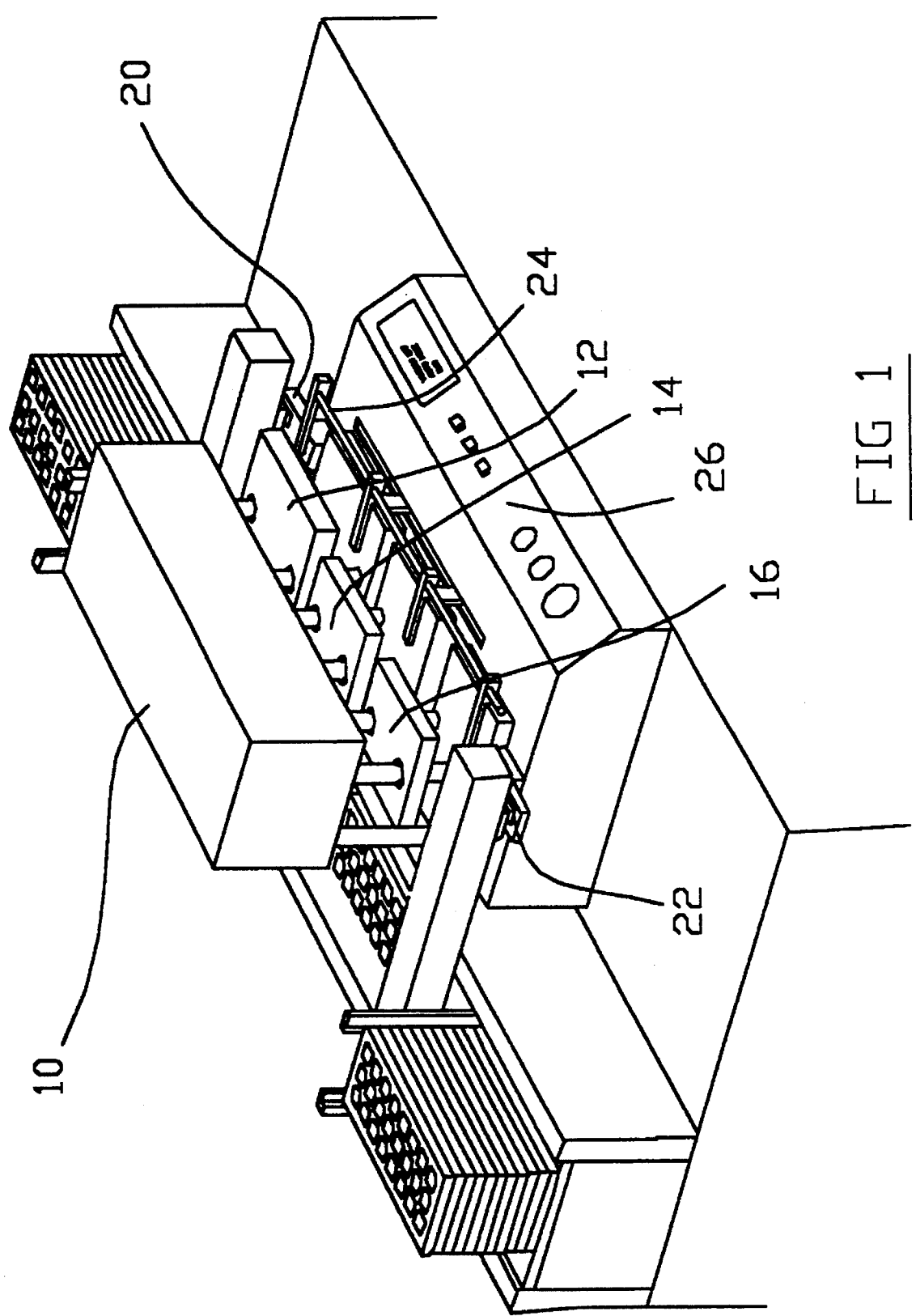
FIG. 1 shows a lead conditioning apparatus in accordance with the present invention.

Reference will now be made in detail to the preferred embodiment of the invention, which is illustrated in the accompanying figures. Turning now to the drawings, wherein like components are designated by like reference numerals throughout the various figures, attention is directed to FIGS. 1 and 2A–2I.

Lead conditioning apparatus 10 incorporating the present invention is shown in perspective in FIG. 1, while the operation of lead conditioning apparatus 10 is represented in FIGS. 2A–2I. The lead conditioning apparatus includes three conditioning stations, engaging and massaging station 12, forming station 14, and reforming station 16. A semiconductor device 18 is passed from starting point 20, through each of the three stations, and to final point 22 by hand or other means for moving the device into position, such as part handling shuttle 24. In the preferred embodiment, a microprocessor (not shown) controls the timing and operation of lead conditioning apparatus 10, with the user initiating the process through control panel 26.

A damaged semiconductor device 28 has a plurality of leads 30 projecting from a molded body 32 in a substantially deformed configuration. As is shown in FIG. 2A, a number of leads 30 have been pressed together, generally designated 34, and do not project from molded body 32 in a parallel configuration. Other leads, generally designated 36, have been bent vertically relative to molded body 32 and are no longer coplanar. The steps of each of the three stations of lead conditioning apparatus 10 are diagrammatically illustrated in FIGS. 2A–2I, introducing the general operation of the present invention. A more complete discussion of the various components and operation of each of the three stations is provided below in conjunction with FIGS. 3–11.

To reintroduce the parallelism between leads, the damaged device is initially placed either manually or automatically in package nest 38 of engaging and massaging station 12, shown in FIG. 2B. Pressure pin 40 is lowered, pushing down on the damaged semiconductor device and compressing spring 42, shown in FIG. 2C. By lowering the package nest, lead sweep plate 44 encounters leads 30 and bends them in an upward direction relative to molded body 32. The bend in leads 30 nearest the molded body is partially opened when the leads are bent in an upward direction. Turning to FIG. 2D, a comb 46 completely engages the leads at a point near the molded body. The comb is moved away from molded body 32 to a massaging position, FIG. 2E, where the comb oscillates first in one direction then in the opposite direction and then back to center, substantially perpendicular to leads 30, as shown in FIG. 2F. The comb and the pressure pin are disengaged and the damaged semiconductor device, now having parallel leads 30, is removed from the package nest.

The damaged semiconductor device is transferred to forming station 14, FIG. 2G, for forming the leads to a partially unbent condition. Pressure pad 48 holds damaged semiconductor device 28 in position on form anvil or support 50. Clamping arm 52 is pivoted toward the support, compressing a portion of the leads between the clamping arm and the support. The bend in leads 30 nearest molded body 32 is reformed, while the bend near the tips of the leads, represented by the interrupted lines, has been opened by the movement of clamping arm 52. As will be hereinafter discussed in relation to FIGS. 7–9, clamping arm 52 engages only a portion of the leads, minimizing scraping of the plated finish on the leads.

After the leads have been formed to a partially unbent configuration at forming station 14, damaged semiconductor device 28 is moved to reforming station 16 where a predetermined configuration will be reintroduced to the leads, shown in FIG. 2H. The damaged semiconductor device is positioned on support member 54, and is held in place by pressure pad 56. Reform punch 58 lowers, pressing the ends of the leads against reform anvil 59. The reform punch and the reform anvil compress the partially unbent leads, shown by the interrupted lines, to form the lead to the predetermined configuration. Since the bend proximate the molded body is reformed at forming station 14, reforming station 16 need only form the bend proximate the ends of the leads, substantially reducing contact between the leads and the reform punch and reform anvil.

Semiconductor device 18, FIG. 2I, is removed from the reforming station with the leads projecting from molded body 32 in a parallel, predetermined configuration. The leads have been reformed without damaging the molded body or scraping the plated lead finish. The semiconductor device is now in a condition for mounting to a circuit board.

Turning to FIGS. 3–6, engaging and massaging station 12 will now be discussed in greater detail. Package nest 38 is positioned within elevator block 60 which is supported by spring 42. Lead sweep plate 44 surrounds the package nest and bends the leads upward as the elevator block is lowered when pressure pin 40 compresses spring 42, providing means for opening one of the bends of the predetermined configuration of leads 30. Bending the leads upward relative to molded body 32 opens the bend nearest the molded body to partially remove lead memory of the predetermined configuration as well as other bends in the lead. Moreover, bending the leads upward facilitates insertion of a comb for reintroducing a predetermined amount of spacing between the leads and substantially removing elastic memory of the pressed together condition.

The package nest includes means for sensing the positioning of the semiconductor device, such as vacuum sensor 62. Vacuum cup 64 within the elevator block is connected to the surrounding environment through air access opening 66 in package nest 38. When the semiconductor device is accurately placed in the package nest, the molded body blocks the opening, creating a vacuum and triggering the vacuum sensor. The signal is intercepted by the microprocessor and engaging and massaging station 12 may begin operation.

If the semiconductor device is improperly positioned on the package nest, the molded body will not completely cover the opening and no vacuum will be created. The engaging and massaging station will not operate until the semiconductor device has been properly placed. Similarly, a semiconductor device with a larger molded body will not fit within the package nest and create a vacuum. The failure to produce a vacuum prevents activation of the engaging and massaging station so that the oversized or improperly positioned semiconductor device will not be damaged. The improperly positioned device may be manipulated to cover air access opening 66, while the oversized semiconductor device may be set aside and processed after the necessary adjustments to the engaging and massaging station have been made. Thus, the engaging and massaging station of the present invention accounts for the large tolerances of the molded body of semiconductor devices 18.

Pivot plate 68 having a plurality of alignment slots 70 surrounds, but does not support, the lead sweep plate. The pivot plate is free to rotate relative to the lead sweep plate with the aid of crossed roller bearing 72. The elevator block inserted in the center of lead sweep plate 44 prevents any movement by the lead sweep plate in response to the rotation of pivot plate 68.

Pivot plate 68 rotates relative to lead sweep plate 44 as pivot arm 74 is moved by a plurality of air cylinders through a comb massage cycle. Lead sweep cylinder 76 moves the pivot arm in one direction to first outer stop 78, and then in the opposite direction to second outer stop 80. The location of the first and second outer stops is determined by adjustable stops 82. The range of movement of pivot arm 74 can easily be increased or decreased by changing the setting of the adjustable stops. The degree of rotation by the pivot plate relative to the lead sweep plate may thereby be controlled by the operator.

As the lead sweep cylinder drives the pivot arm away from second outer stop 80, overbend cylinder 84 is activated moving overbend intermittent stop 86 into the path of pivot arm 74. Centering cylinder 88 is then activated, engaging centering overbend stop 90 to stop the pivot arm and center the pivot plate relative to the lead sweep plate. The timing of the operation of intermittent stops 86, 90 is controlled by the microprocessor.

Figure 3:
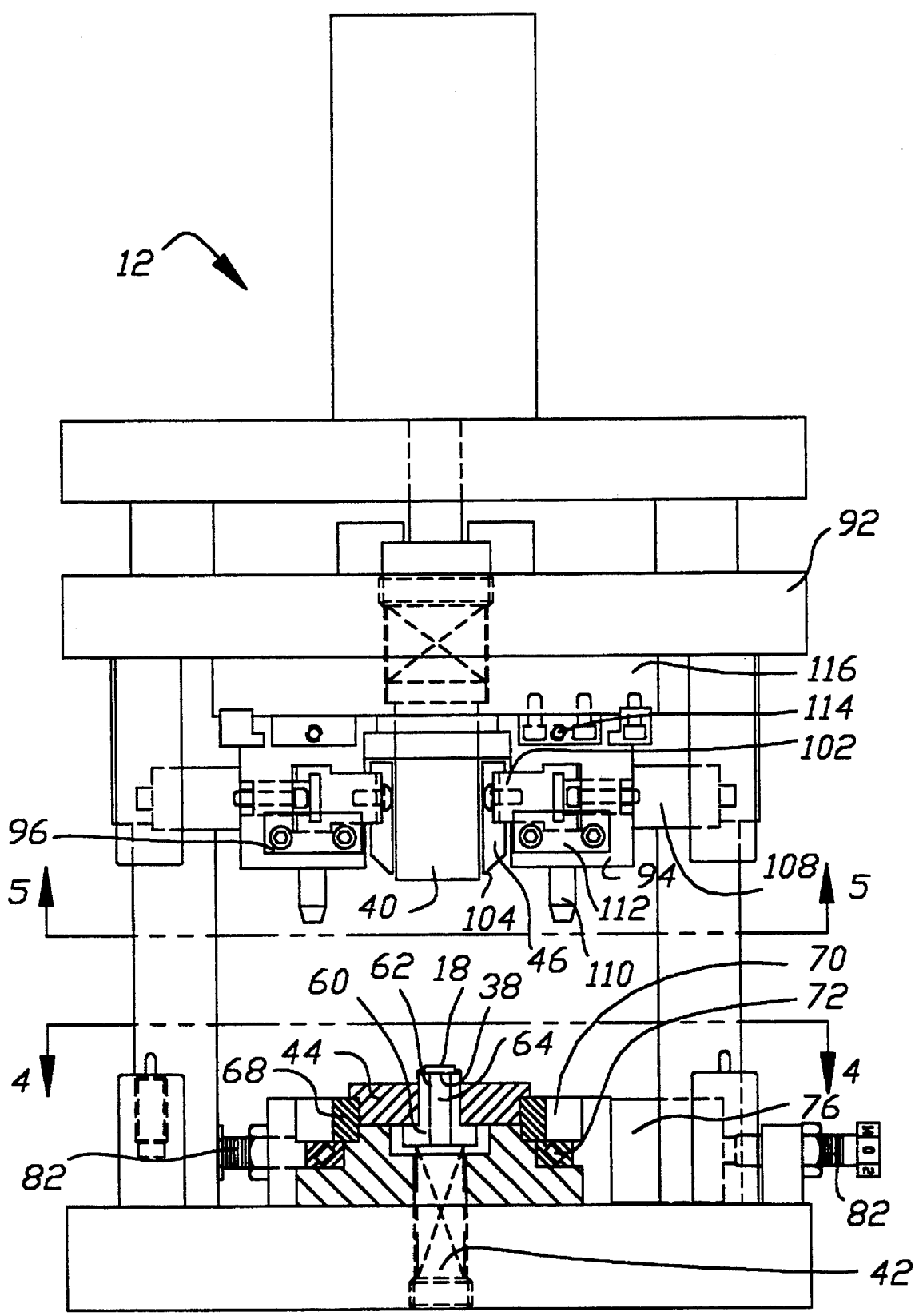
FIG. 3 shows a frontal view partially broken away of an engaging and massaging station in accordance with the present invention, shown in an open position.
Figure 4:
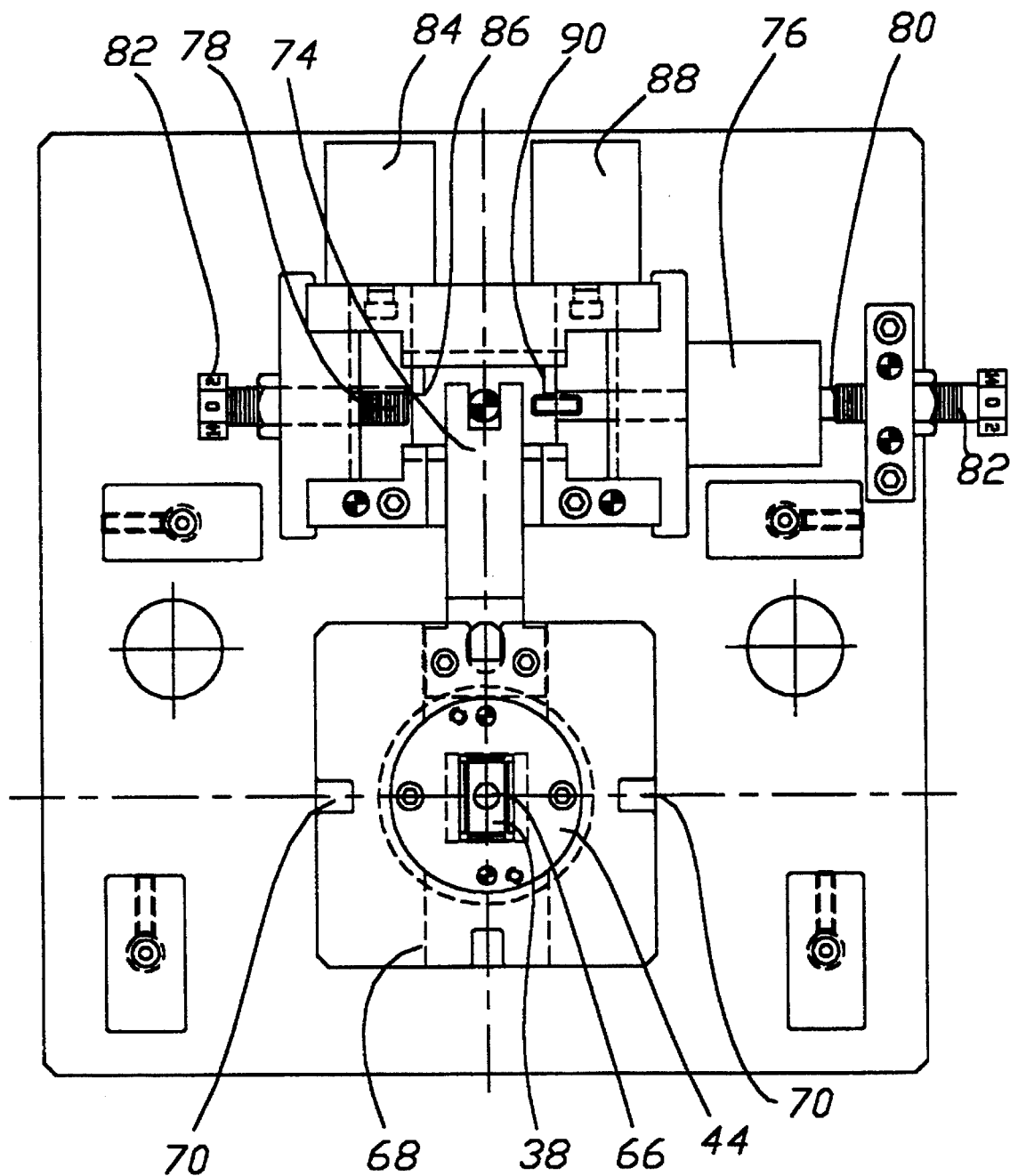
FIG. 4 shows a view of the engaging and massaging station taken substantially along line 4—4 in FIG. 3.
Figure 5:
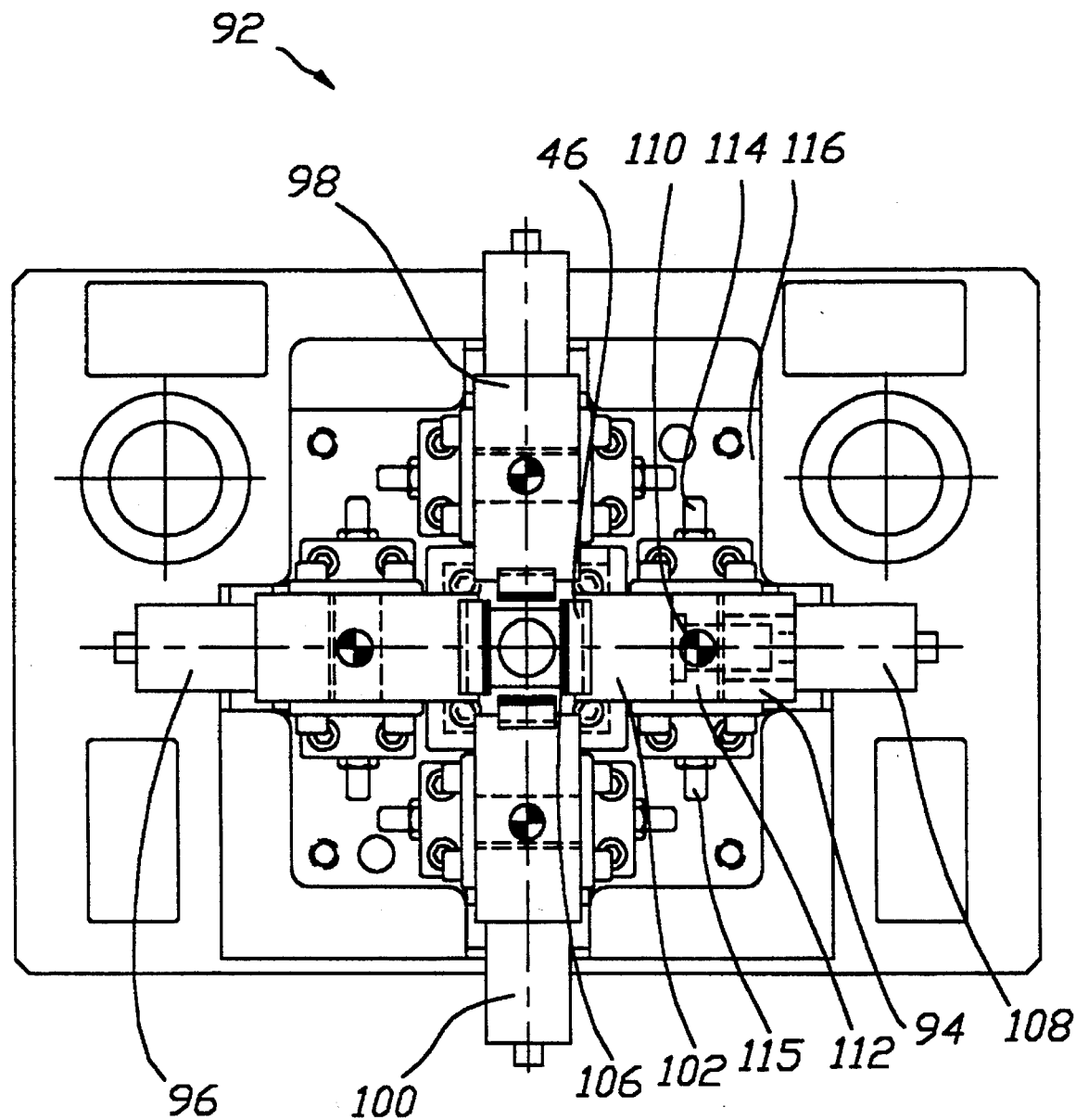
FIG. 5 shows a view of the engaging and massaging station taken substantially along line 5—5 in FIG. 3 showing the upper die.
Figure 6:
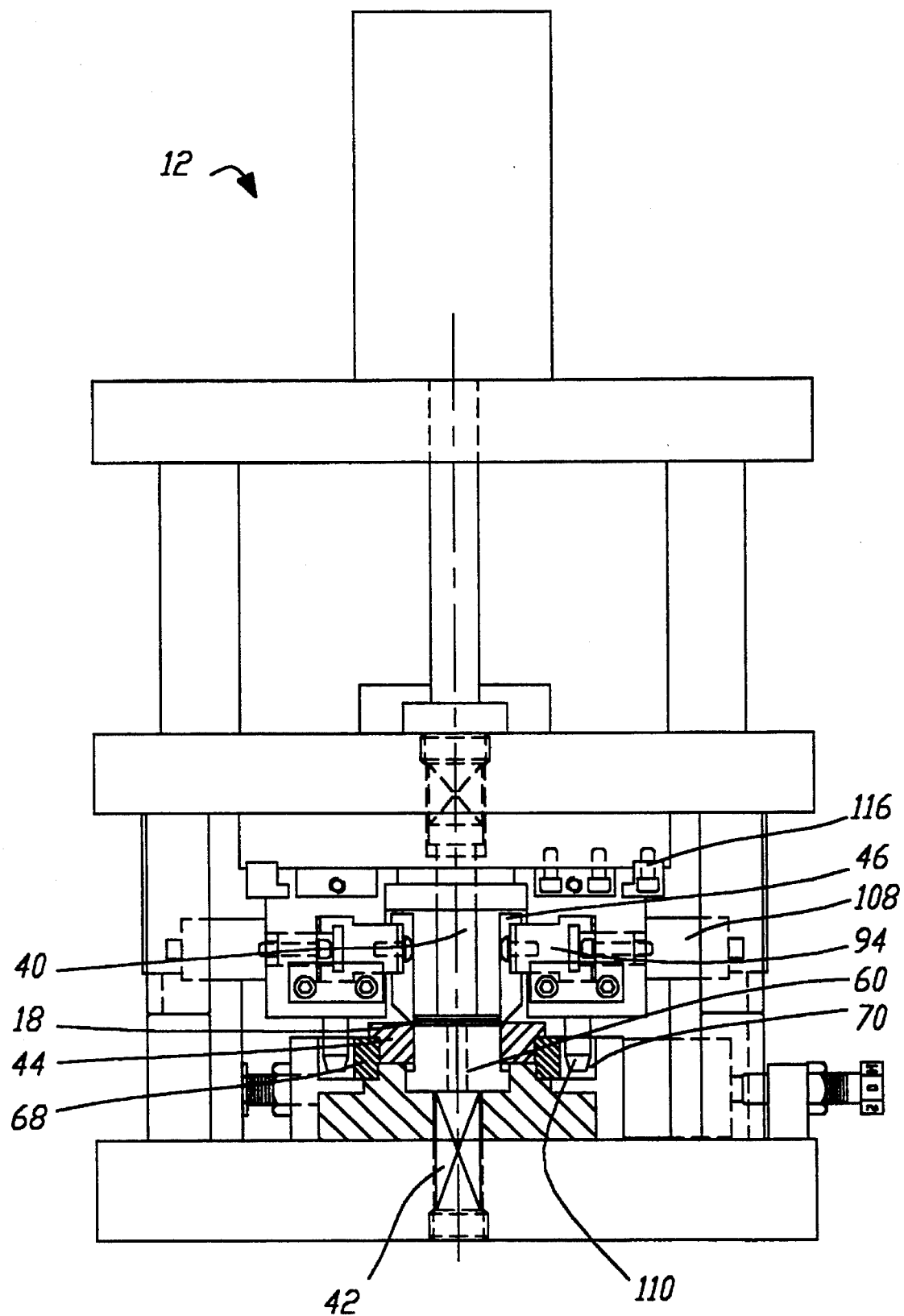
FIG. 6 shows a frontal view partially broken away of an engaging and massaging station in accordance with the present invention, pictured in a closed position.

Upper die 92 of the engaging and massaging station includes at least one comb assembly 94 generally opposing one side of package nest 38. In the preferred embodiment, engaging and massaging station 12 includes four comb assemblies 94, 96, 98, 100 as represented in FIG. 5. In FIGS. 3 and 6, for clarity, the front portion of the engaging and massaging station is broken away, showing only comb assemblies 94, 96. Including a different number of the comb assemblies in engaging and massaging station 12 is within the scope of the present invention. To simplify the discussion of the upper die, only the components of comb assembly 94 will be described. It is to be understood that the remaining comb assemblies are identical to comb assembly 94.

Comb assembly 94 includes comb 46, mounted to comb mounting block 102. To provide the strength and dimensions required for massaging the leads, the comb is beveled to tip 104 which is formed having a plurality of teeth 106. As shown in FIGS. 3 and 5, the teeth are formed only at the bottommost end of tip 104. The combination of a thick comb with a bevel to narrow teeth provides a great amount of strength in a relatively small cross sectional area. The teeth can thus engage and massage the leads without breaking.

The comb assembly includes means for moving the comb through the leads, such as slide cylinder 108. The comb mounting block is coupled to slide cylinder 108, which moves the comb from an engaging position, near the molded body of a semiconductor device positioned in the package nest, to a massaging position at the tips of leads 30 as indicated by the interrupted lines in FIG. 3. Alignment pin 110 is mounted to slide cap 112 of the upper die generally opposing alignment slot 70 of the pivot plate. Comb mounting block 102 slips along the slide cap, which holds the alignment pin stationary relative to the movement of the slide cylinder. Spring plungers 114, 115 connect comb mounting block 102 to top mounting plate 116 of the upper die, allowing for the oscillation of the comb in a direction perpendicular to the movement of the slide cylinder.

When the upper die is lowered to a closed position, shown in FIG. 6, pressure pin 40 pushes on the molded body, lowering elevator block 60. The lead sweep plate forces the leads upward relative to molded body 32, opening the first bend near the body of the semiconductor device. By opening the bend, elastic memory of the first bend is removed from the leads so that once the leads are reformed the leads will not spring back to the previous configuration. Bending the leads upward relative to the semiconductor body also facilitates massaging of the leads by the combs. Once the elevator block is lowered, alignment pin 110 is inserted into alignment slot 70 and while comb 46 is inserted in between the leads and moved to a massaging position at the lead tips.

The alignment pin moves with the rotation of pivot plate 68, causing the comb mounting block to move between spring plungers 114, 115. Since alignment slot 70 is larger than alignment pin 110, the alignment pin travels slightly within the alignment slot, translating the rotation of the pivot plate into a linear movement of comb 46 in a direction substantially perpendicular to leads 30. As the pivot plate rotates, comb 46 massages the leads by bending them to either side of molded body 32. Thus, the pivot plate controls the oscillation of the comb.

In the preferred embodiment, the alignment pins of comb assemblies 94, 96, 98, 100 each are inserted into the corresponding alignment slot of the pivot plate. The rotation of the pivot plate moves the four combs perpendicular to the leads projecting from each side of semiconductor device 18, simultaneously reintroducing parallelism to all the leads. Thus, the engaging and massaging station of the present invention introduces a predetermined amount of spacing between the leads, bringing them into parallelism.

Figure 7:
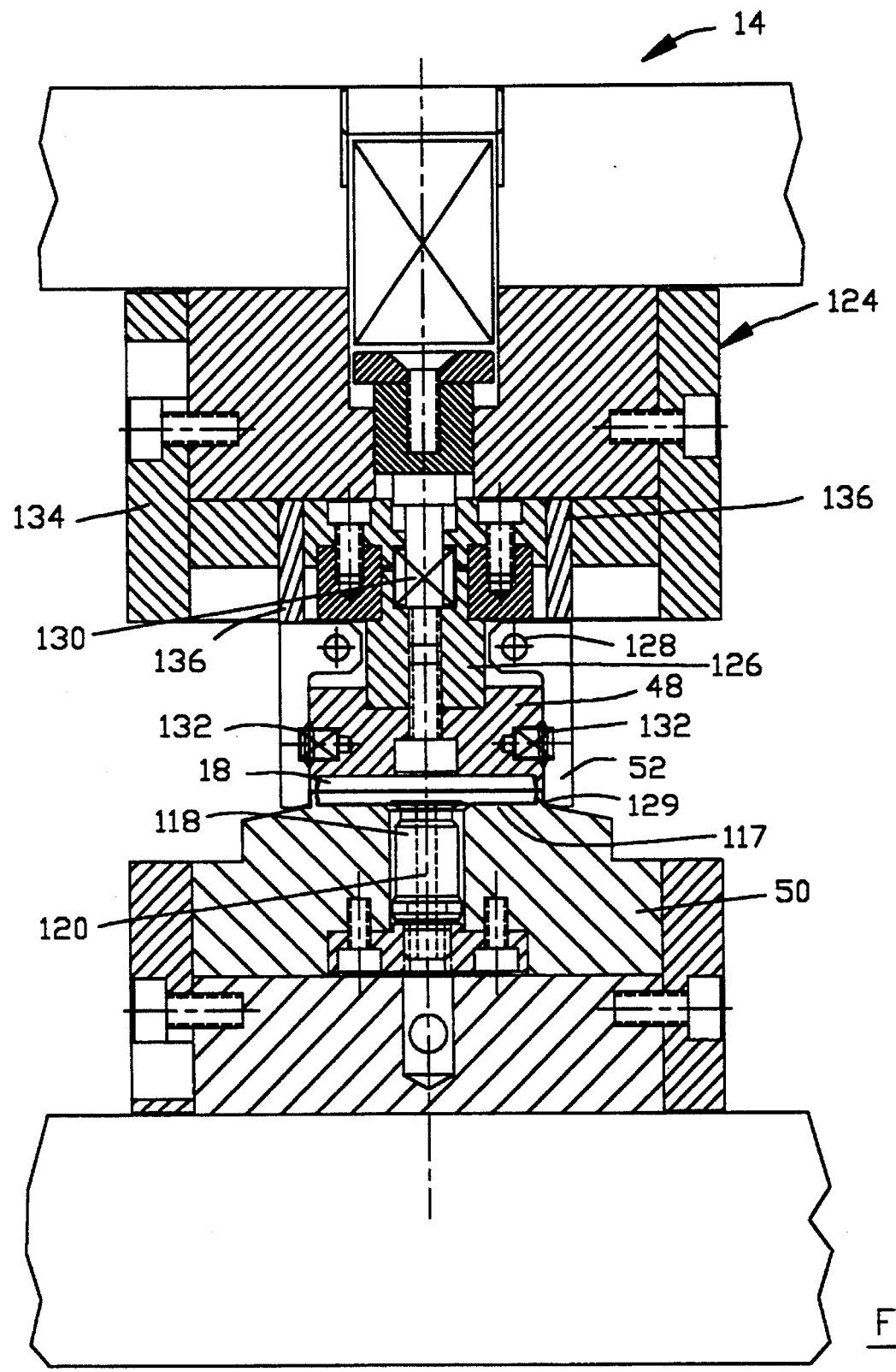
FIG. 7 shows a frontal cross sectional view of a forming station in accordance with the present invention, shown in a closed position.
Figure 8:
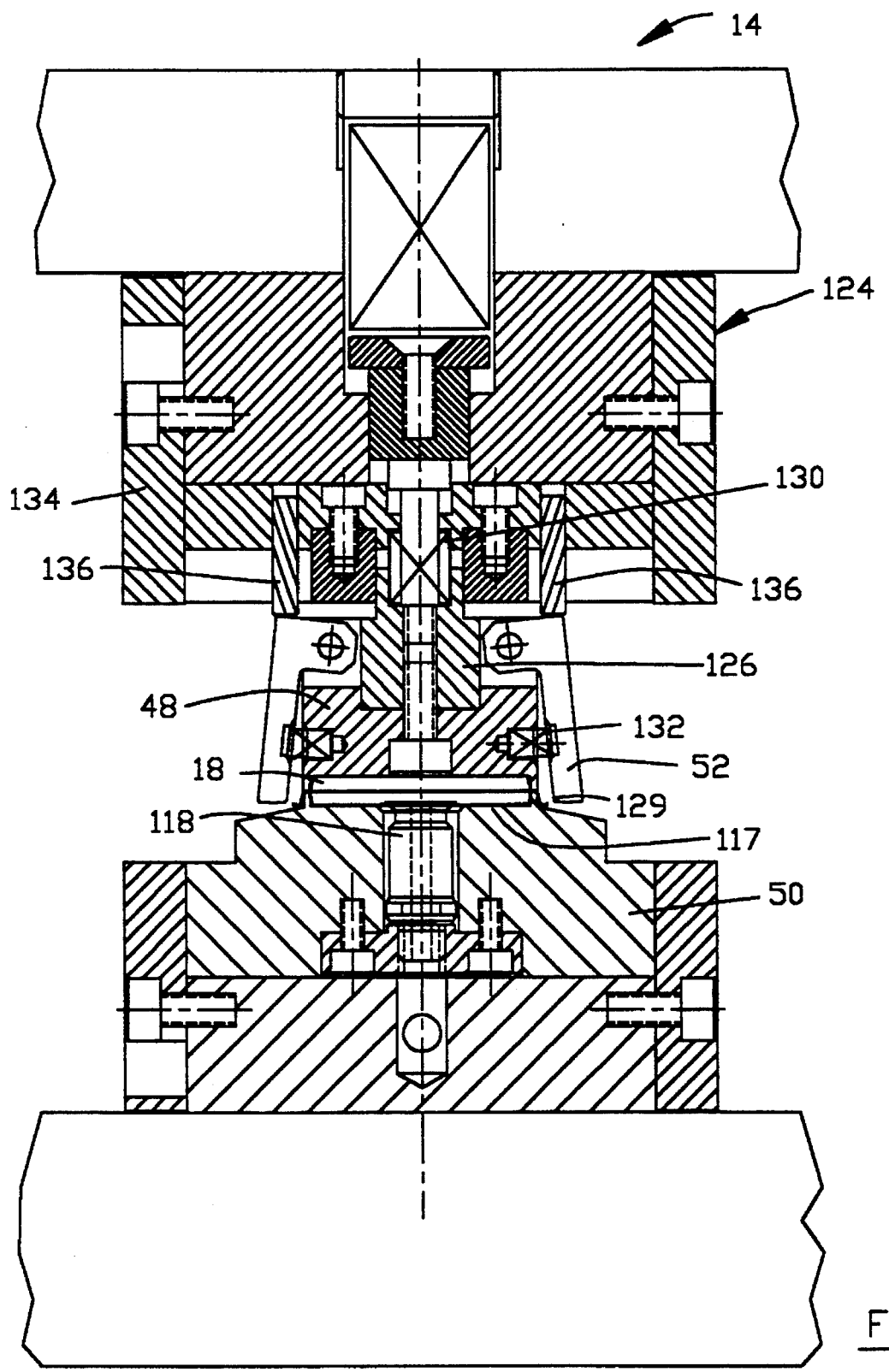
FIG. 8 shows an enlarged view of a portion of the forming station of FIG. 7, shown with the pivotal arms spaced from the leads of the semiconductor device.
Figure 9:
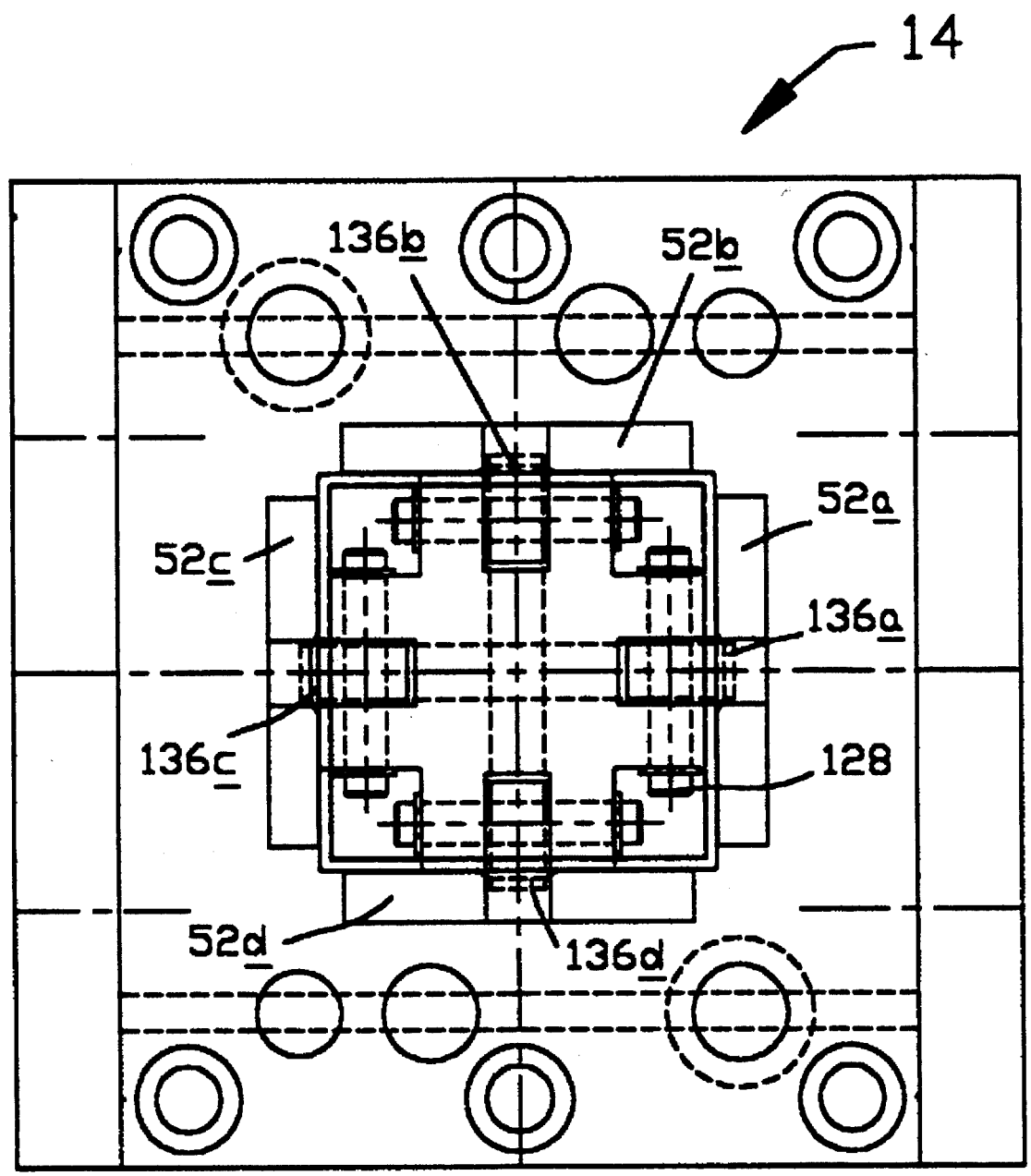
FIG. 9 shows a top view of the forming station of FIG. 7.

After the parallelism has been reintroduced to the leads, semiconductor device 18 is transferred to forming station 14, shown in FIGS. 7–9. The forming station includes package nest 117 positioned within form anvil or support 50. The package nest includes means for sensing the proper placement of the semiconductor device, such as vacuum sensor 118. As discussed above in relation to engaging and massaging station 12, the vacuum sensor is placed within vacuum cup 120 connected to the environment by air access opening (not shown) in the package nest. The proper placement of the semiconductor device creates a vacuum, and the microprocessor activates an air cylinder (not shown) initiating the operation of the forming station.

The forming station includes an upper die assembly, generally designated 124, which is lowered toward the form anvil once operation of the forming station has been initiated. Spring loaded pressure pad 48, carried by upper die assembly 124, provides means for clamping the leads to the support or form anvil 50. As is evident in FIGS. 7 and 8, the pressure pad clamps the leads to the form anvil at a point near molded body 32 without exerting any pressure on the molded body. Since the semiconductor device is held in place by securing leads 30 between support 50 and pressure pad 48, the molded body will not be cracked or damaged as the leads are formed.

A support block 126 is positioned above pressure pad 48. At least one clamping arm 52 is pivotally coupled to the support block by an axle 128 for forming the leads to a partially unbent condition. Clamping arm 52 has a lead forming surface 129 which is configured for clamping a portion of each of the leads to the support. Preferably, lead forming surface 129 is curved to minimize the surface area of clamping arm 52 which contacts the leads. A spring 130 coupled between support block 126 and clamping arm 52 urges the clamping arm away from the leads of semiconductor device 18, as is shown in FIG. 8. In the present embodiment, the forming station preferably includes four clamping arms 52a–d each positioned opposite one side of semiconductor device 18 for simultaneously forming the leads projecting from each side of the device (FIG. 9).

Once pressure pad 48 contacts support 50, the upper die assembly continues to move downward, compressing spring 132, until upper base portion 134 engages support block 126. Spring 132 partially absorbs the force of impact of base portion 134 as it is moved onto the support block, protecting the clamped leads from potential damage. The upper base portion includes four actuators 136a–d each positioned to engage one of the four clamping arms. When the Upper base portion is lowered, the actuators pivot the clamping arms about axles 128 from a first position with the clamping arms spaced from leads 30 (FIG. 8) to a second position with lead forming surface 129 clamping a portion of the leads to support 50. With springs 130, which are compressed between arms 52 and support block 126, the clamping arms are gradually lowered against the leads until lead forming surface 129 clamps a portion of leads 30 against support 50, minimizing the impact to the leads.

Clamping a portion of the leads between clamping arms 52 and support block 126 forms the leads to a partially unbent condition. In the present embodiment, the first bend nearest the package (opened at the engaging and massaging station) is reformed and the second bend near the tip of the lead is opened when lead forming surface 129 of the clamping arms engages a portion of the leads. Opening the second bend removes elastic memory so that when the bend is reformed it will not spring back to the deformed position. The contact area between the clamping arms and the leads is minimized since the lead forming surface engages only a portion of the leads. Pivoting the clamping arms into position substantially reduces friction between the lead forming surface and the lead finish. The springs 130 further limit the force applied to the leads by the clamping arms. The forming station of the present invention substantially minimizes scraping of the plated finish on the leads.

After the leads have been formed to a partially unbent condition by clamping arms 52, upper die assembly 124 is lifted from support 50. First, base portion 134 is raised moving actuators 136a–d away from the clamping arms. Springs 130 urge the clamping arms outward to a position spaced from the leads, shown in FIG. 8. As the upper die assembly continues to move upward, pressure pad 48 is released and the support block and pressure pad are removed from support 50. The semiconductor device may be removed from package nest 117 and transported to reforming station 16 for reforming the leads to a predetermined configuration.

Figure 10:
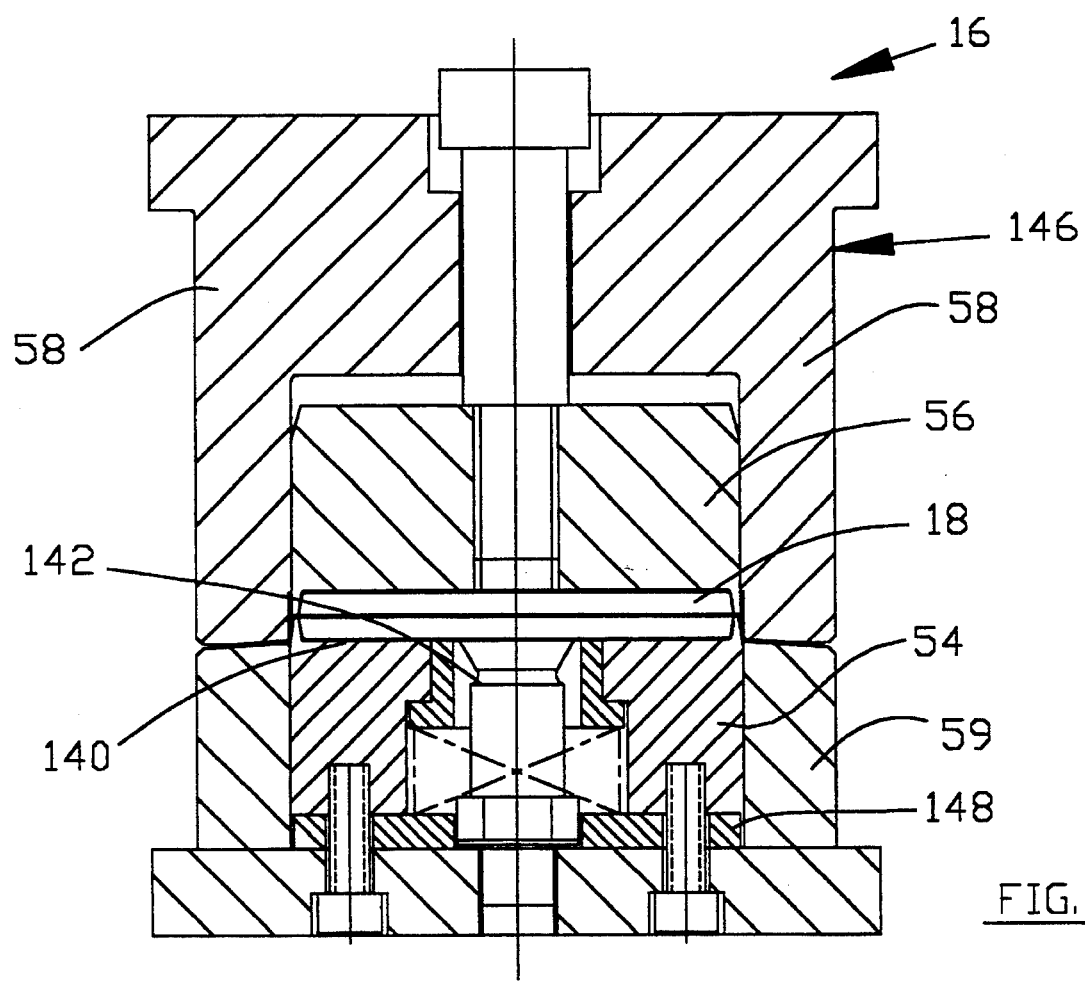
FIG. 10 shows a cross sectional view of a reforming station in accordance with the present invention, shown reforming the leads of a first semiconductor device.
Figure 11:
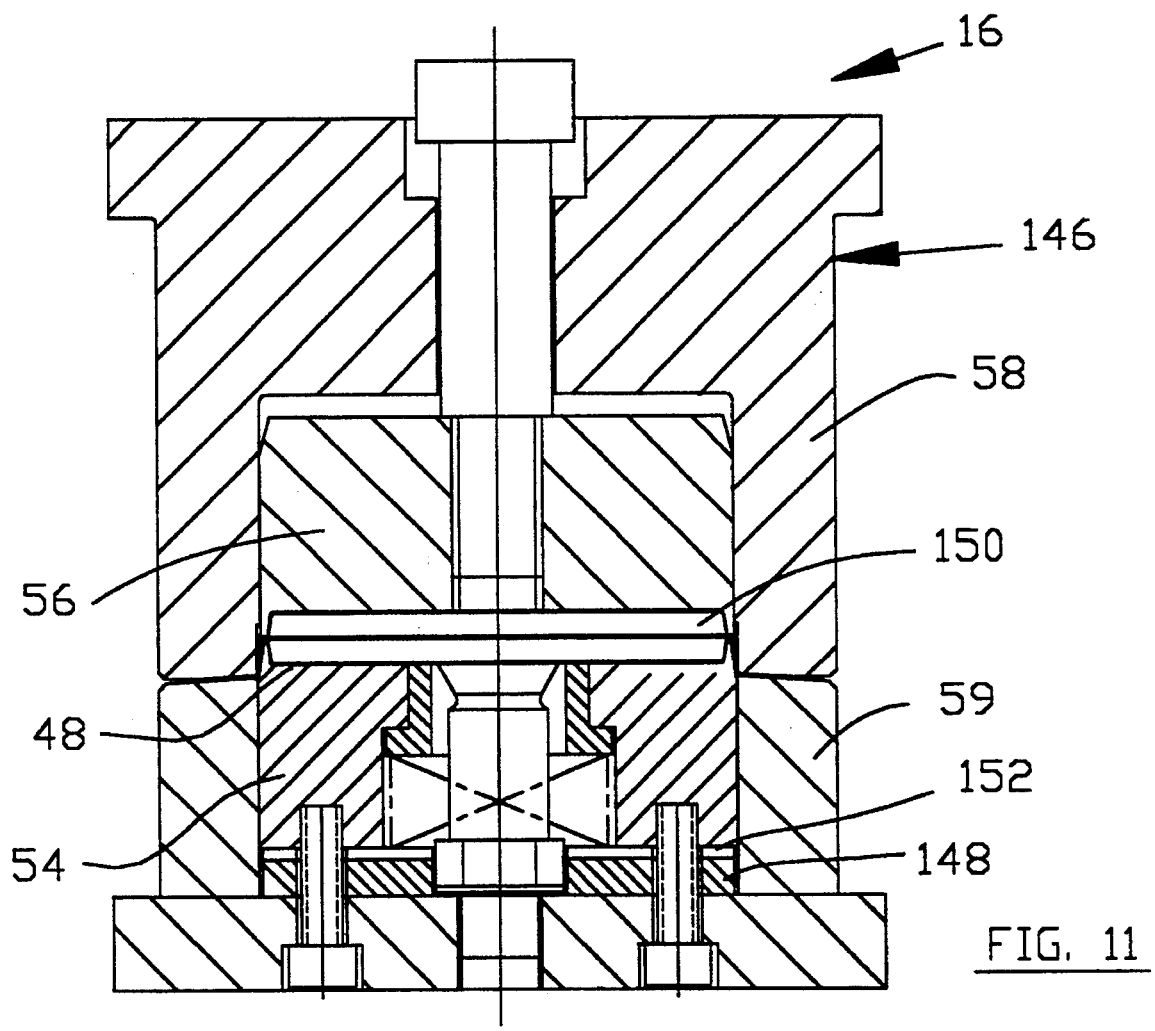
FIG. 11 shows a cross sectional view of the reforming station of FIG. 10, shown reforming the leads of a second semiconductor device.

Reforming station 16, shown in FIGS. 10–11, includes a package nest 140 positioned within support member 54. Package nest 140 is similar in construction to package nest 117, including a vacuum sensing device 142 for sensing the proper placement of the semiconductor device in the package nest. The microprocessor activates an air cylinder (not shown) initiating operation of the reforming station once proper placement of device 18 is detected by the sensing device 142. The reforming station includes an upper die assembly, generally designated 146, which is lowered toward the support member and reform anvil when the semiconductor device is positioned in package nest 140. A spring loaded pressure pad 56, carried by upper die assembly 146, provides means for clamping the leads to support member 54. The pressure pad clamps the leads to the support member at a point near molded body 32 without exerting any pressure on the molded body, protecting the molded body from becoming cracked or damaged.

The tips of leads 30, which project from the pressure pad and support member, are positioned on reform anvil 59. Once the semiconductor device is securely retained in place by pressure pad 56, reform punch 58 is lowered to reform the leads to a predetermined configuration. In the present embodiment, reform punch 58 engages the tip of the leads to reform the second bend with the tips of the leads positioned in a plane parallel to the body of the semiconductor device. The first bend, near molded body 32, was reformed at forming station 14 when the second bend near the tip of the lead was opened. Since the reform punch contacts only the tips of the leads, scraping or scratching of the lead finish is minimized. In the preferred embodiment, reforming station 14 includes four reform punches, each opposing one of the four sides of molded body 32.

Reform anvil 59 and reform punch 58 are complementarily configured to reintroduce a predetermined configuration to leads 30 as the leads are compressed therebetween. By changing the shape of the reform anvil 54 and reform punch, other configurations may be introduced to the leads. Thus, the reforming station of the present invention may be used for various types of semiconductor devices having parallel leads projecting from the molded body in a predetermined configuration.

Semiconductor device 30 has a standoff dimension defined as the distance between the bottom of the molded body and the bottom of lead tip 33, generally designated A in FIG. 2I, and a terminal dimension defined as the distance between the lead tips on opposite sides of the semiconductor device, generally designated B in FIG. 2I. The standoff dimension A and the terminal dimension B of semiconductor devices produced by different manufacturers often vary in size. Factors influencing the standoff and terminal dimensions include the location of the second bend near the tip of the leads and the length of leads 30. The reforming station of the present invention may be used to reform the leads of semiconductor devices having different standoff and terminal dimensions.

The reforming station of the present invention includes means for adjusting the position of support body 54 relative to reform anvil 59. One such adjustment means is provided by at least one spacer element 148 positioned below support member 54 to retain the support member in an elevated position relative to reform anvil 59. As is shown in FIG. 10, spacer element 148 positions the semiconductor device so that reform punch 58 and reform anvil 59 form the leads to a predetermined configuration by reforming the second bend near the lead tip 33. Turning to FIG. 11, the leads of a semiconductor device 150 having a greater standoff dimension than semiconductor device 18 are reformed by the reform punch and anvil. A second spacer element 152 is positioned beneath support member 54 to increase the height of the support member relative to reform anvil 59. With the second spacer element, semiconductor device is positioned so that the leads are reformed to the desired configuration.

By replacing spacer element 148 with a spacer having a different thickness, or by adding additional spacer elements as in FIG. 11, the height of the support member 54 relative to the reform anvil 59 may be adjusted to accommodate variations in standoff and terminal dimensions. Using one spacer element or combining several spacer elements to achieve the desired thickness is within the scope of the present invention. The spacer elements may have any thickness, depending upon the different standoff and terminal dimensions of the various semiconductor devices. For example, spacer elements having a thickness in the range of 0.002 to 0.02 inches are suitable for reforming semiconductor devices from several different manufacturers.

In one embodiment of the present invention, semiconductor device 18 is manually transferred between the three stations. In an alternative embodiment, means for automatically transferring the semiconductor device, such as part handling shuttle 24 (FIG. 1), are included. The part handling shuttle of the preferred embodiment is equipped to simultaneously transfer a semiconductor device from each of the three stations to the next succeeding station. The three stations may each simultaneously condition a semiconductor device. Thus, lead conditioning apparatus 10 is capable of continuous operation.

Figure 12:
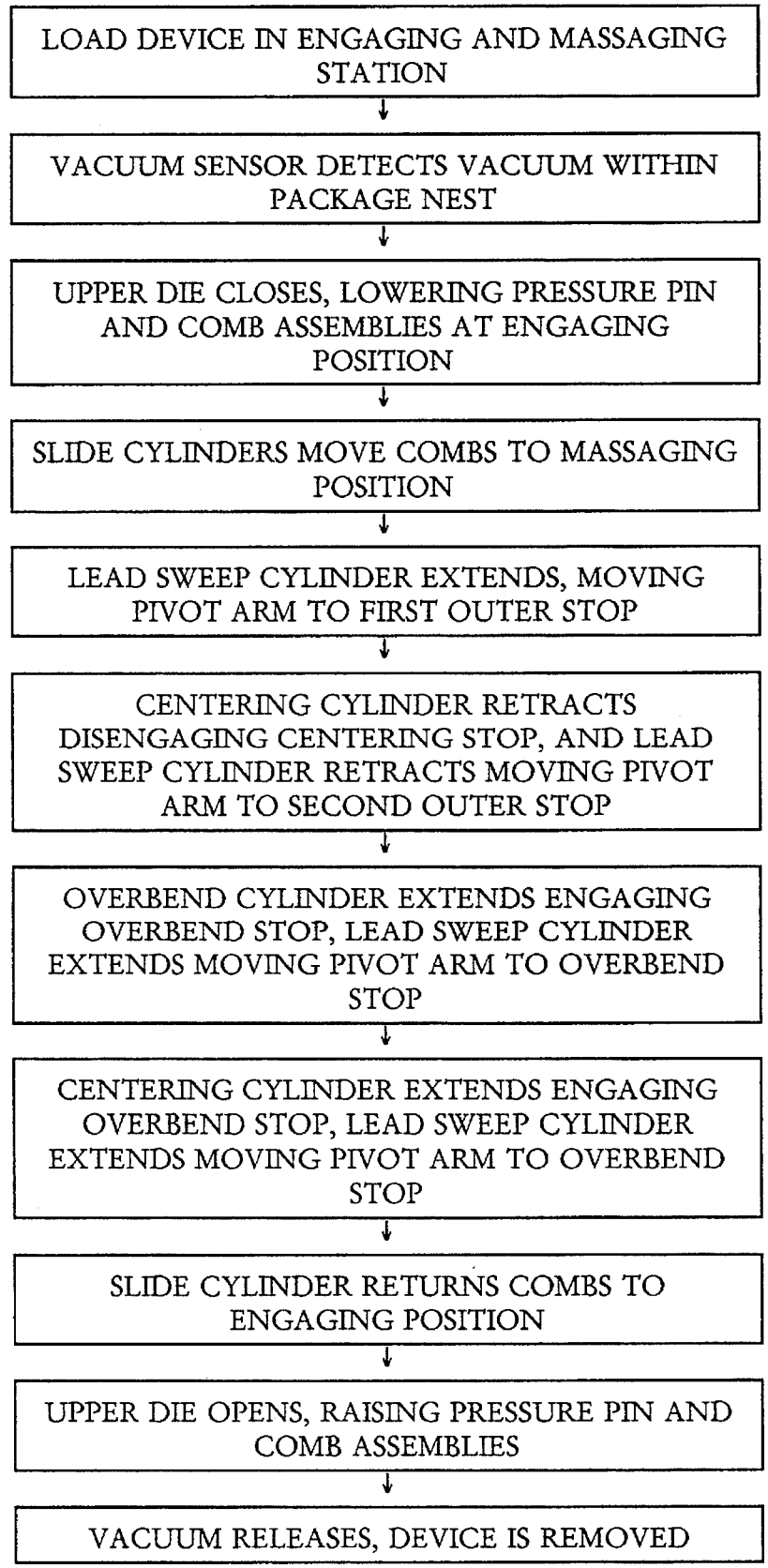
FIGS. 12 is a flow chart showing the operational steps of the engaging and massaging station of a lead conditioning system in accordance with the present invention.
Figure 13:
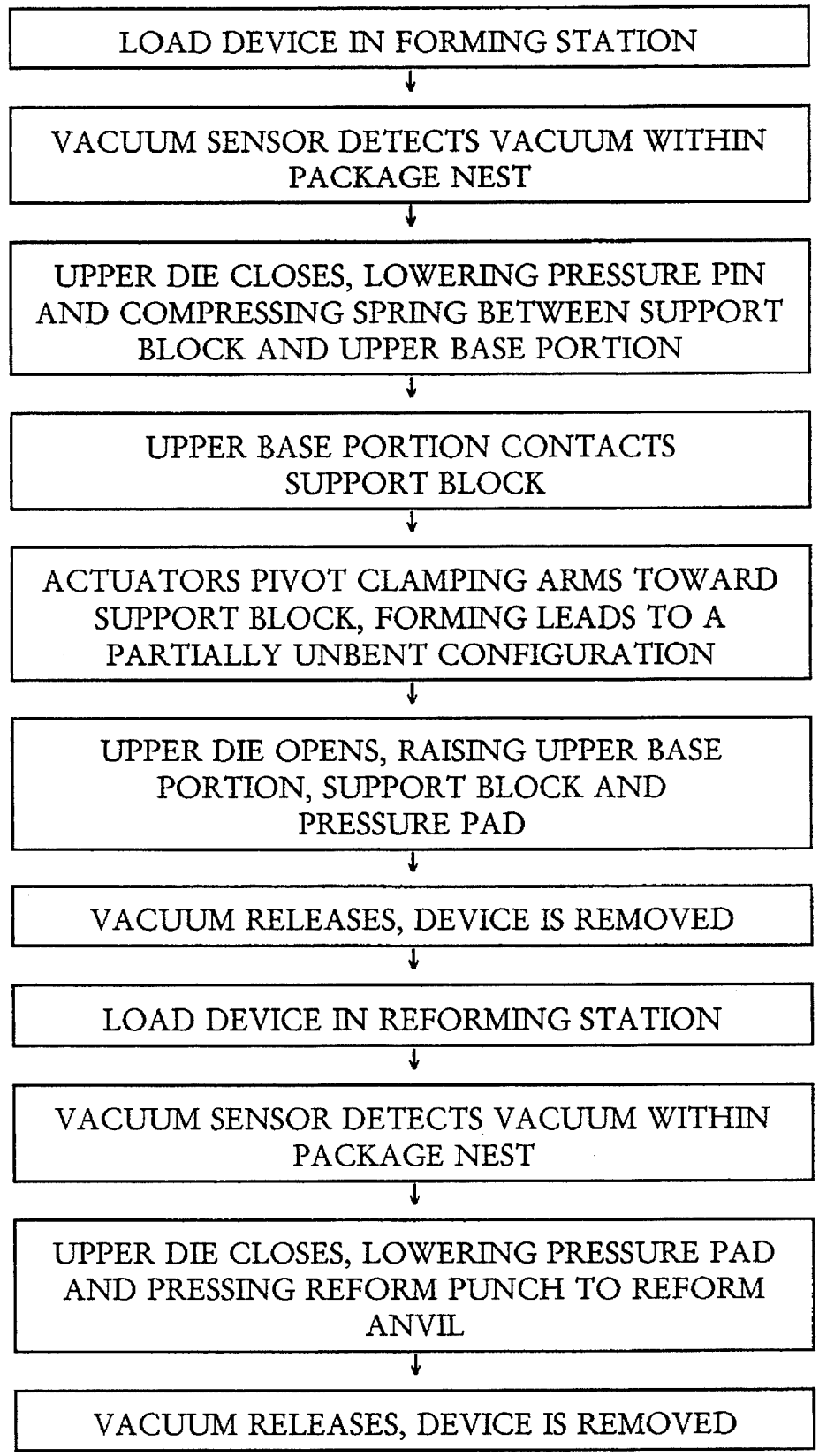
FIG. 13 is a flow chart showing the operational steps of the forming and reforming stations of a lead conditioning system in accordance with the present invention.

A description of the method and sequence of operation of the lead conditioning system of the present invention is represented in the flow charts of FIGS. 12 and 13. As is set forth in FIG. 12, to ensure proper alignment of pivot plate 68 of the engaging and massaging station, the air cylinders extend and retract, moving pivot arm 74 through a comb massage cycle while package nest 38 is empty. Semiconductor device 18 is then loaded into the engaging and massaging station to bring the bent leads into parallelism. Once the accurate placement of semiconductor device 18 has been sensed, the upper die closes lowering pressure pin 40 and comb assembly 94. The molded body is lowered relative to lead sweep plate 44, bending the leads upward. The combs are inserted in between the leads at an engaging position near molded body 32.

Slide cylinder 108 extends, moving comb 46 from the engaging position to a massaging position at the tips of leads 30. The comb is oscillated at least once by the extension and retraction of the air cylinders, bending the leads alternatively toward either end of molded body 32 to remove the elastic memory of the pressed together position. The upper die is opened, raising the comb and leaving the leads projecting perpendicularly from the molded body.

The semiconductor device is transferred from the engaging and massaging station to the forming station, where the leads are formed into an at least partially unbent condition. Turning to FIG. 13, once the device has been loaded in the forming station, the accurate placement of the device on the form anvil is sensed. The upper die closes, lowering pressure pad 48 to clamp the leads on form anvil 50 and compressing spring 130 between the upper base portion and the support block. The actuators pivot the clamping arms toward the support block to form the leads to a partially unbent configuration. The upper die opens, raising the upper base portion, support block and pressure pad.

After the bends have been formed to a partially unbent configuration, the semiconductor device is loaded in the reforming station for reforming the leads to the desired configuration. The accurate placement of the semiconductor device on support member 54 is sensed, and the upper die closes lowering pressure pad 56 to the support member and reform punch 58 to the reform anvil. Reform punch 58 is pressed against the reform anvil, compressing the leads into a predetermined configuration. After the leads have been compressed, the upper die opens, raising the pressure pad and reform punch. The conditioned semiconductor device has parallel leads projecting from the molded body in a predetermined configuration, and is ready for mounting on a circuit board.

What is claimed is:

1. An apparatus for conditioning the bent leads of a semiconductor device of the type normally having parallel leads projecting from a body in a predetermined configuration comprising:

means for engaging and massaging said leads to reintroduce a predetermined spacing between each of said leads projecting from said body to bring said leads into parallelism;

means for forming said leads to a partially unbent condition, said forming means including a support formed to receive said semiconductor device and at least one arm pivotal between a first position spaced from said leads and a second position compressing a portion of said leads between said arm and said support; and means for reforming said leads to said predetermined lead configuration.

2. The apparatus of claim 1 wherein, said arm is pivotally mounted to a movable base member by an axle extending through said arm, and said forming means includes at least one actuator positioned for pivoting said arm about said axle toward said leads.

3. The apparatus of claim 1 wherein, said reforming means includes a reform anvil for supporting said semiconductor device and at least one reform punch, said reform punch and said reform anvil being configured for reintroducing at least one bend of said predetermined configuration to said leads.

4. The apparatus of claim 3 wherein, said reforming means includes a support member formed to receive said semiconductor device and means for adjusting said support member relative to said reform anvil.

5. The apparatus of claim 1 wherein, said predetermined configuration has a plurality of bends, and further including means for opening the one of said bends proximate said body of said semiconductor device.

6. The apparatus of claim 1, further including means for sensing the proper positioning of said semiconductor device on said support for forming said leads to said partially unbent condition.

7. The apparatus of claim 1, further including means for moving said semiconductor device into position for the conditioning of said leads.

8. An apparatus for conditioning the bent leads of a semiconductor device of the type normally having parallel leads projecting from a body in a predetermined configuration comprising:

a support for holding said semiconductor device when conditioning said leads;

at least one arm pivotal about a pivot axis between a first position spaced from said leads and a second position compressing a portion of said leads between said arm and said support;

said arm and said support being configured for forming said leads to an intermediate configuration when said arm is in said second position to remove memory from said leads of said predetermined configuration and any bends distorting said predetermined configuration; and means for pivoting said arm between said first position and said second position, said pivoting means including at least one actuator configured for reciprocating movement relative to said arm, said actuator having a contact surface engaging a portion of said arm spaced from said pivot axis and said actuator pivoting said arm about said pivot axis from said first position to said second position when said actuator is moved toward said arm in a direction substantially perpendicular to said contact surface of said actuator to substantially minimize sliding movement of said contact surface relative to said arm.

9. The apparatus of claim 8 wherein, said support includes means for sensing the proper positioning of said semiconductor device for the conditioning of said leads.

10. The apparatus of claim 8, further including a support block and an axle pivotally mounting said arm to said support block, said support block being movable between a deployed position and a disengaged position.

11. The apparatus of claim 8 wherein, said pivoting means includes at least one spring urging said arm away from said leads.

12. The apparatus of claim 8 wherein, said semiconductor device has four sides and said leads project from said four sides of said semiconductor device, and said forming means includes at least one arm for each of said four sides and means for simultaneously pivoting said arms toward said support for compressing a portion of said leads on each of said four sides between said arms and said support.

13. The apparatus of claim 8, further including means for engaging said leads at a point near said body, means for moving said engaging means from said point near said body toward the tips of said leads, and means for massaging said leads to reinforce said parallelism to said leads projecting from said semiconductor device.

14. An apparatus for conditioning the bent leads of a semiconductor device of the type normally having parallel leads projecting from a body in a predetermined configuration, said predetermined configuration including a first bend proximate said body and a second bend proximate a tip of said leads; comprising:

a support for holding said semiconductor device when conditioning said leads;

at least one arm pivotal between a first position spaced from said leads and a second position compressing a portion of said leads between said arm and said support;

said arm and said support being configured for forming said leads to an intermediate configuration when said arm is in said second position to remove memory from said leads of said predetermined configuration and any bends distorting said predetermined configuration;

means for pivoting said arm between said first position and said second position; and said arm and said support member being configured for reforming said leads to said first bend of said predetermined configuration and removing memory from said leads of said second bend of said predetermined configuration.

15. An apparatus for conditioning the bent leads of a semiconductor device of the type normally having parallel leads projecting from a body in a predetermined configuration comprising:

a support for holding said semiconductor device when conditioning said leads;

at least one arm pivotal between a first position spaced from said leads and a second position compressing a portion of said leads between said arm and said support;

said arm and said support being configured for forming said leads to an intermediate configuration when said arm is in said second position to remove memory from said leads of said predetermined configuration and any bends distorting said predetermined configuration, said arm including a lead forming surface having a radius of curvature such that when said arm is in said second position, only a portion of said leads is compressed between said lead forming surface and said support; and means for pivoting said arm between said first position and said second position.

16. An apparatus for conditioning the bent leads of the type normally having parallel leads projecting from a body in a predetermined configuration, said semiconductor device having a plurality of bends in said leads, comprising:

a support for holding said semiconductor device when conditioning said leads;

at least one arm pivotal between a first position spaced from said leads and a second position compressing a portion of said leads between said arm and said support;

said arm and said support being configured for forming said leads to an intermediate configuration when said arm is in said second position to remove memory from said leads of said predetermined configuration and any bends distorting said predetermined configuration;

means for opening the one of said bends proximate said body of said semiconductor device; and means for pivoting said arm between said first position and said second position.

17. The apparatus of claim 16 wherein, said opening means includes a first support member formed to receive said body with said leads projecting from said first support member and a second support member surrounding said first support member, at least one of said first support member and said second support member being movable relative to the other such that, after movement, said leads are bent towards said body by said second support member opening said bends proximate said body of said semiconductor device.

18. An apparatus for conditioning the bent leads of a semiconductor device of the type normally having parallel leads projecting from a body in a predetermined configuration comprising:

means for engaging and massaging said leads to reintroduce a predetermined spacing between each of said leads projecting from said body to bring said leads into parallelism;

means for forming said leads to a partially unbent condition; and means for reforming said leads to a predetermined lead configuration, said reforming means includes a support member formed to receive said semiconductor device, a reform anvil proximate said support member and means for adjusting said support member relative to said reform anvil.

19. The apparatus of claim 18 wherein, said adjusting means includes at least one spacer element positioned below said support member, said spacer element being configured for positioning said support member for receiving a semiconductor device having a predetermined size.

20. The apparatus of claim 19 wherein, said spacer element has a thickness of 0.002 to 0.02 inches.

21. A method for conditioning bent leads of a semiconductor device which normally has a plurality of parallel uniformly configured leads projecting from a body, said method comprising the steps of:

bringing said leads into parallelism;

positioning said semiconductor device on a support;

pivoting at least one arm toward said leads of said semiconductor device and compressing a portion of said leads between said arm and said support to form said leads to a partially unbent condition; and shaping said leads in a desired lead configuration.

22. The method of claim 21, and further including the step of opening a first bend of said lead, said first bend being positioned proximate said body of said semiconductor device.

23. The method of claim 21 wherein, said pivoting step includes forming said leads to a first bend proximate said body and opening a second bend proximate a tip of each of said leads.

24. The method of claim 23 wherein, said shaping step includes reforming said leads to said second bend proximate said tip of said leads.

* * * * *